(12) United States Patent
Yang et al.

(10) Patent No.: US 9,066,424 B2
(45) Date of Patent: Jun. 23, 2015

(54) PARTITIONED HYBRID SUBSTRATE FOR RADIO FREQUENCY APPLICATIONS

(71) Applicant: Hong Kong Applied Science and Technology Research Institute Company Limited, Hong Kong (HK)

(72) Inventors: Dan Yang, Hong Kong (HK); Song He, Hong Kong (HK); Yuxing Ren, Hong Kong (HK); Xunqing Shi, Hong Kong (HK)

(73) Assignee: Hong Kong Applied Science and Technology Research Institute Company Limited, Hong Kong Science Park Shatin, New Territories, Hong Kong (HK)

( * ) Notice: Subject to any disclaimer, the term of this patent is extended or adjusted under 35 U.S.C. 154(b) by 238 days.

(21) Appl. No.: 13/941,554

(22) Filed: Jul. 15, 2013

(65) Prior Publication Data

US 2015/0016078 A1 Jan. 15, 2015

(51) Int. Cl.
*H05K 1/18* (2006.01)
*H05K 1/02* (2006.01)
*H05K 3/00* (2006.01)
*C23C 28/00* (2006.01)

(52) U.S. Cl.
CPC .............. *H05K 1/024* (2013.01); *H05K 3/0058* (2013.01); *H05K 3/007* (2013.01); *C23C 28/40* (2013.01); *Y10T 156/1057* (2015.01)

(58) Field of Classification Search
USPC .................................... 361/761, 748; 205/125
See application file for complete search history.

(56) References Cited

U.S. PATENT DOCUMENTS

| | | | |
|---|---|---|---|
| 6,657,523 B2 | 12/2003 | Tarui et al. | |
| 7,349,196 B2 | 3/2008 | Chang et al. | |
| 7,477,197 B2 | 1/2009 | Zeng et al. | |
| 7,679,925 B2 * | 3/2010 | Fukuoka et al. | 361/761 |
| 8,335,084 B2 | 12/2012 | Lee et al. | |
| 2001/0012655 A1 * | 8/2001 | Nordstom et al. | 438/239 |
| 2005/0245001 A1 | 11/2005 | Hyvonen et al. | |
| 2012/0280877 A1 | 11/2012 | Chirila et al. | |
| 2013/0099389 A1 | 4/2013 | Hong et al. | |

* cited by examiner

*Primary Examiner* — Andargie M Aychillhum
(74) *Attorney, Agent, or Firm* — Ella Cheong Hong Kong; Sam T. Yip

(57) ABSTRACT

The presently claimed invention is to provide a package for compact RF signal system, and a method to form the package thereof in order to miniaturize the size of package, improve signal integrity, and reduce manufacturing cost. The package comprises a hybrid substrate with a sandwiched structure, in which the hybrid substrate comprises an upper layer and a lower layer with different dielectric properties being separated by an interposer for improving electrical isolation and mechanical stiffness. Metal layers are formed on the sidewalls of the opening to surround an active component, such that the metal sidewalls together with two ground plates in the upper and lower layers constitute a self-shielding enclosure inside the package to protect the active component.

13 Claims, 7 Drawing Sheets

| Structure | Upper layer | Interposer | Lower layer |
|---|---|---|---|
| Material | Ceramic-PTFE composite | FR4 | Polyimide (PI) Kapton |
| Dielectric property | $\varepsilon_r = 10.2$, $\tan\delta = 0.002$ | $\varepsilon_r = 4.0$, $\tan\delta = 0.02$ | $\varepsilon_r = 3.5$, $\tan\delta = 0.01$ |
| Cost | High | Low | Low |
| CTE (ppm/°C) | 47 | 50 | 20 |
FIG. 5
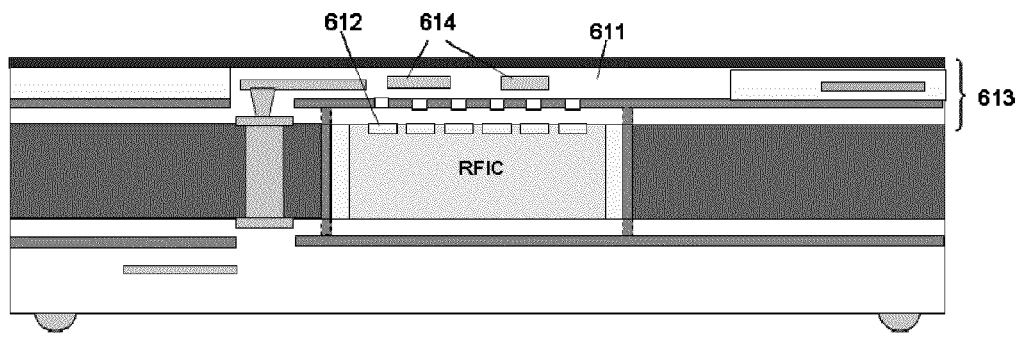
FIG. 6A
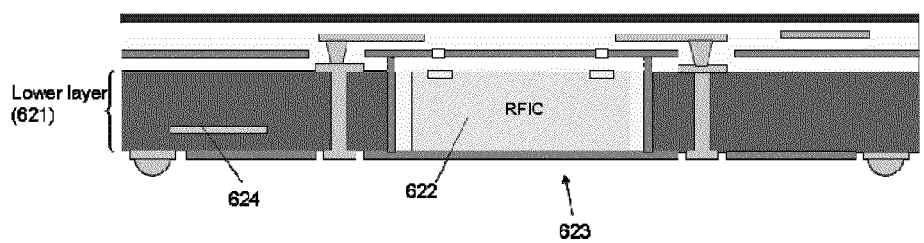
FIG. 6B

PARTITIONED HYBRID SUBSTRATE FOR RADIO FREQUENCY APPLICATIONS

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates generally to radio frequency signal system, and more specifically, to a package for compact radio frequency signal system, and a method for producing the package.

BACKGROUND

Currently, radio frequency or mixed signal system in portable/wearable electronics is urgently calling for heterogeneous integration (for example, integration of radio frequency, digital, and power systems) and reduced form factor so as to meet the need in miniaturizing the size of products. Advanced packaging technology such as three-dimensional packaging is a potential solution to achieve this.

Considering signal integrity, radio frequency and digital/power signal paths should be electrically separated, and low loss substrate such as low temperature co-fired ceramic is recommended to route high frequency or ultra high frequency signals.

On the other hand, another critical issue is that radio frequency integrated circuit, being a sensitive device, should be electromagnetically shielded, while its antenna still keeps unaffected.

U.S. Pat. No. 6,657,523 discloses a stacked radio-frequency module formed by stacking packages each storing monolithic microwave integrated circuits (MMICs) and mounting another package upside down which stores a control circuit for controlling MMICs. The MMICs and control circuits are each sealed by a metal sealing lid within the cavity of each of the packages which are spatially completely separated from each other. Each of the pads for wiring paths for radio-frequency signals and for power supply/control signals and ground pads are provided within each package and at opposing surfaces of packages to be stacked with corresponding pads joined by a gold bump.

U.S. Pat. No. 7,477,197 provides an integration of antenna and RF front-end module, relating an electronic assembly including a substrate having a first surface and a second surface opposite the first surface. The electronic assembly also includes a RF front-end module coupled to the first surface of the substrate, and a ground plane layer positioned on the second surface of the substrate, an insulating layer on the ground plane layer, with the ground plane layer positioned between the second surface and the insulating layer. In addition, the electronic assembly further comprises an antenna layer on the insulating layer, with the insulating layer positioned between the antenna layer and the ground plane layer.

U.S. Pat. No. 8,335,084 discloses an electronic system or module which includes embedded actives and discrete passives, and methods for use in fabricating packages containing embedded active devices and/or discrete passive devices. The module comprises a plurality of build-up layers defining circuit interconnections and that comprise one or more thin film type of embedded passive devices, at least a cavity formed in the build-up layers, and at least an active device and/or at least a discrete passive device disposed in the cavity and electrically connected to the circuit interconnections of the build-up layers. The build-up layers may be mounted to a core, and the core may be attached to a printed circuit board.

Nonetheless, the above prior arts fail to provide a packaging system for radio frequency signals, which carries optimized performance in electrical properties and EM shielding, an ultra-small form factor, and a low cost solution at the same time.

SUMMARY OF THE INVENTION

The presently claimed invention is to provide a package for compact radio frequency (RF) signal system, and a method to form the package thereof in order to miniaturize the size of package, improve the signal integrity, and reduce manufacturing cost.

Accordingly, a first aspect of the presently claimed invention is to provide a package for compact RF signal system, comprising a hybrid substrate with a sandwiched structure, in which the hybrid substrate comprises an upper layer and a lower layer with different dielectric properties being separated by an interposer for improving electrical isolation and mechanical stiffness. The upper layer, located above the interposer, with low loss dielectric material includes one or more components operable for transmitting RF signal of a radio frequency integrated circuit (RFIC) chip to an antenna arranged on top of the upper layer. The lower layer, located below the interposer, with high loss dielectric material, includes one or more components operable for transmitting low frequency signal of the RFIC chip to outside circuit. The low loss dielectric material has a value of loss tangent lower than that of the high loss dielectric material that helps to reduce the transmission loss of the package. Apart form the RFIC chip, other active components can be embedded inside the hybrid substrate as well. According to an embodiment of the present invention, the interposer has an opening, where the RFIC chip or other active components are located between the upper and lower layers.

In accordance to an embodiment of the presently claimed invention, metal layers are formed on the sidewalls of the opening to surround the RFIC chip, such that the metal sidewalls together with two ground plates in the two layers constitute a self-shielding enclosure inside the package to protect the RFIC chip from electromagnetic interference.

A second aspect of the presently claimed invention is to provide a method to form a package for compact RF signal system, comprising drilling or etching an opening through the interposer, electroplating or depositing shielding metal on sidewalls of the opening for surrounding a RFIC chip, laminating or depositing an upper layer on an upper side of the interposer, laminating or depositing a lower layer on a lower side of the interposer, electroplating and patterning for metallization to redistribute inputs/outputs, printing or plating an antenna on top of the upper layer, and implementing microbumping and panel singulation.

BRIEF DESCRIPTION OF THE DRAWINGS

Embodiments of the present invention are described in more detail hereinafter with reference to the drawings, in which

FIG. 5 is a table indicating materials used for three layers of a hybrid substrate, and their corresponding properties according to one embodiment of the presently claimed invention;

FIG. 6A is a cross sectional view of a first exemplary package according to the presently claimed invention;

FIG. 6B is a cross sectional view of a second exemplary package according to the presently claimed invention;

DETAILED DESCRIPTION OF PREFERRED EMBODIMENTS

In the following description, a package for radio frequency signal system is set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1:
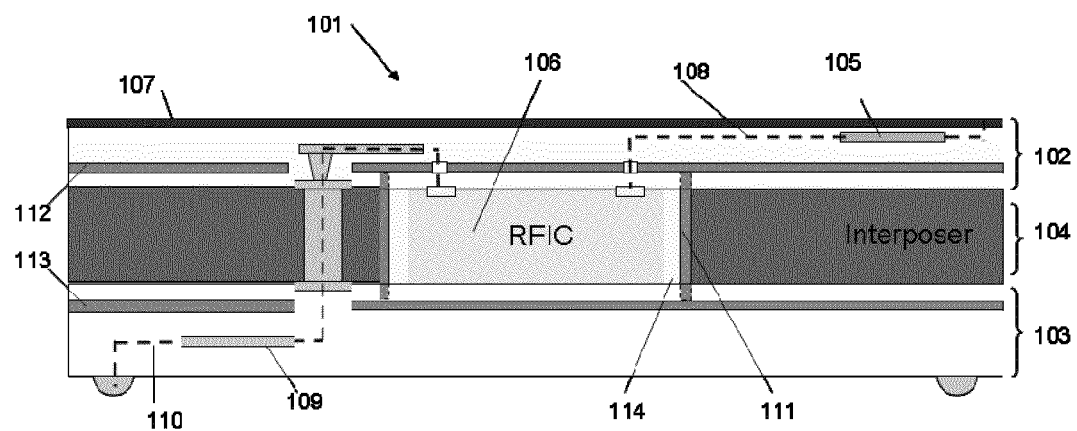
FIG. 1 is a cross sectional view of a package for radio frequency signal system according to one embodiment of the presently claimed invention.

FIG. 1 shows a package for radio frequency (RF) signal system according to one embodiment of the presently claimed invention. A package 101 includes a hybrid substrate having a sandwiched structure comprising an upper layer 102 and a lower layer 103 with different dielectric properties. The upper layer 102 and lower layer 103 are separated by an interposer 104 for improving electrical isolation and mechanical stiffness of the package 101. The interposer 104 has an opening, where a radio frequency integrated circuit (RFIC) chip 106 is arranged between the two layers 102 and 103. The upper layer 102 employs low loss dielectric material, and carries one or more components 105 operable for transmitting RF signal of the RFIC chip 106 to an antenna 107 located on top of the upper layer 102. The components 105 comprise one or more baluns, couplers or filters. A RF signal path 108 between the antenna 107 and the RFIC chip 106 is shown in a dotted line. The lower layer 103 employs high loss dielectric material, and carries one or more components 109 operable for transmitting low frequency signal of the RFIC chip 106 to an outside circuit. The components 109 are able to further transmit power and digital signals, and comprise one or more capacitors or inductors. A low frequency signal path 110 between the RFIC chip 106 and the outside circuit is shown in another dotted line.

The low loss dielectric material has a value of loss tangent lower than that of the high loss dielectric material that helps to reduce the transmission loss of the package. The loss tangent refers to a parameter of a dielectric material that quantifies its inherent dissipation of electromagnetic energy. The preferable range of the loss tangent of the low loss dielectric material is lower than 0.01 while the preferable range of the loss tangent of the high loss dielectric material is in between 0.01 and 1. Generally, transmission loss ($\alpha$) is composed of conduction loss, dielectric loss, and radiation loss, according to the below equation:

$$\alpha \propto f (\tan \delta) \epsilon_r^{1/2}$$

where f denotes frequency, tan $\delta$ denotes loss tangent, and $\epsilon_r$ denotes relative permittivity.

By reducing the loss tangent of the upper layer, the transmission loss is highly reduced according to the present invention.

According to one embodiment of the presently claimed invention, the low loss dielectric material has a value of relative permittivity higher than that of the high loss dielectric material that assists in reduction of thickness of the upper layer.

What's more, the opening is not limited to holding the RFIC chip. Other active components such as a power management chip or digital signal chip can be installed within the opening.

Metal layers are formed on the sidewalls of the opening to surround the RFIC chip 106, such that metal sidewalls 111 together with two ground plates 112 and 113 in the two layers 102 and 103 constitute a self-shielding enclosure inside the package 101 to protect the RFIC chip 106. There is adhesive 114 between the RFIC chip 106 and the metal sidewalls 111 for fixing the position of the RFIC chip 106. Similarly, other active components including a power management chip and digital signal chip can be installed within the self-shielding enclosure as well.

Figure 2:
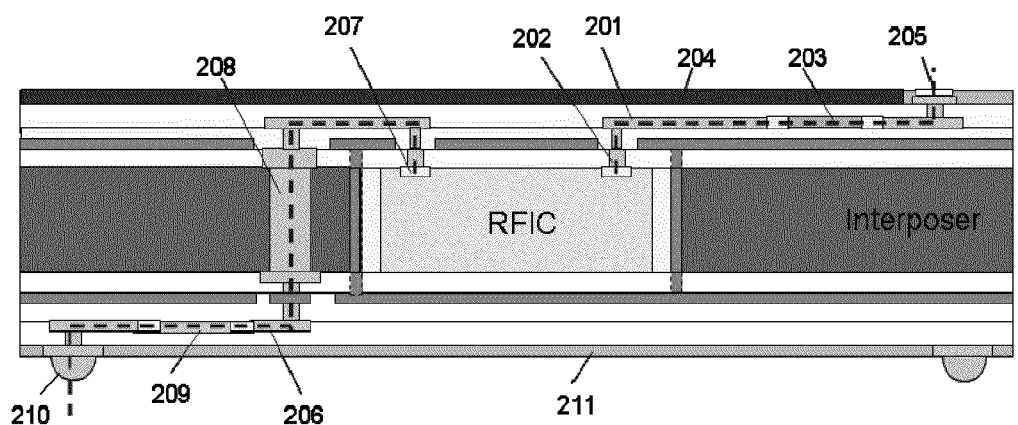
FIG. 2 is a cross sectional view of a package for radio frequency signal system according to another embodiment of the presently claimed invention.
Figure 3A:
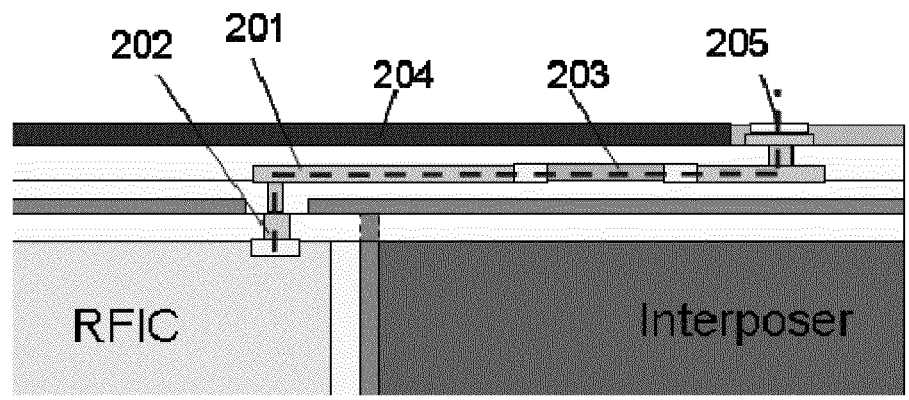
FIG. 3A is a cross sectional view of a magnified part of the package of FIG. 2.
Figure 3B:
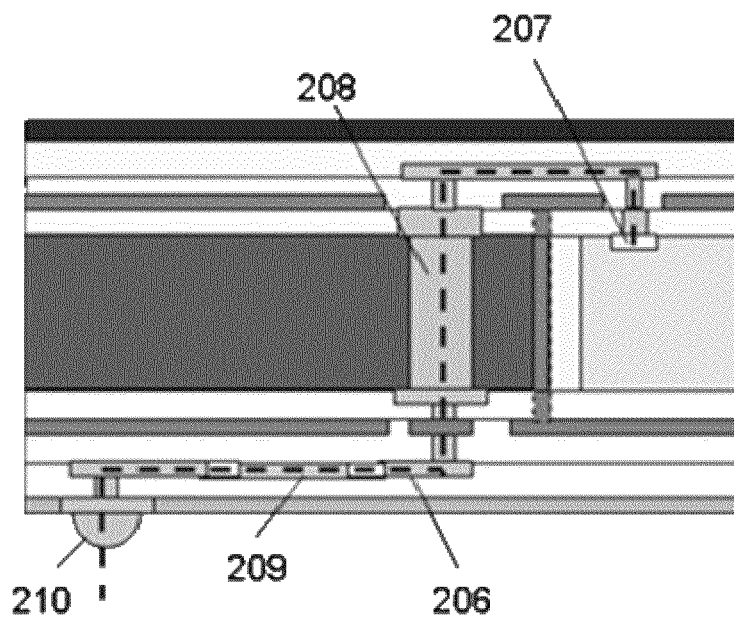
FIG. 3B is a cross sectional view of another magnified part of the package of FIG. 2.

FIG. 2 shows a package for RF signal system according to another embodiment of the presently claimed invention. A path 201 (shown in a dotted line) in the upper layer shows the RF signal transmitting from a RFIC input/output (I/O) 202, to a balun/coupler/filter 203, and finally to an antenna 204 (a magnified view is shown in FIG. 3A). A bond pad 205 is provided for connecting metallization in the upper layer and the antenna 204. A path 206 (shown in another dotted line) in the lower layer shows the low frequency signal transmitting from another RFIC I/O 207, to a through-substrate via 208, then to a capacitor/inductor 209, and finally to a system in package (SiP) bump 210 (a magnified view is shown in FIG. 3B). There is a protective film 211 located on the lower layer.

The presently claimed invention is able to provide a package for RF signal system with better electrical performance Since RF signals are transmitted in the low loss dielectric material, whereas non-related RF and power/digital signals are transmitted in the high loss dielectric material, low loss in transmission can be achieved in the system. Furthermore, the two layers with different dielectric properties are physically separated by an interposer, leading to reduction of coupling effect between the RF signals and non-related RF signals.

Figure 4:
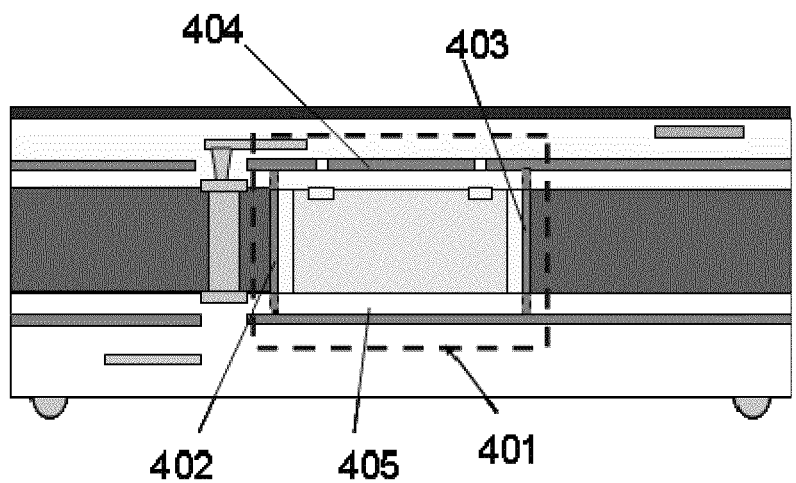
FIG. 4 is a cross sectional view of a package for showing a shielding enclosure according to one embodiment of the presently claimed invention.

Furthermore, as the metal sidewalls are provided inside the opening of the interposer, an enclosure is formed together with the ground plates in the two layers to shield the RFIC, thereby providing an easy-to-implement self-shielding inside the package. FIG. 4 shows a shielding enclosure 401 of a package according an embodiment of the present invention. The shielding enclosure is formed by metal sidewalls 402 and 403, a ground plate 404 in the upper layer, and a ground plate 405 in the lower layer. What's more, such self-shielding inside the package would not affect the antenna located on the package.

Since the upper layer employs high-κ dielectric material, referring to a material with a high relative permittivity, the layer thickness of the package can be highly reduced according to the below equation:

$$\text{Dielectric thickness} \propto 1/(f\epsilon_r^{1/2})$$

where f denotes frequency, and $\epsilon_r$ denotes relative permittivity.

In addition, laminated thin films such as polytetrafluoroethylene (PTFE)/or polyimide (PI) thin film for the upper and lower layers, and components embedded inside are implemented in the package. I/Os are redistributed with bumpless interconnect, and components are located inside the opening of interposer. The above configuration can further reduce the size of package to achieve an ultra-small form factor.

Due to the structure of the hybrid substrate according to the present invention, more high loss laminates are used instead of the low loss laminates in the design of the package. As the cost for high loss laminates is much lower (for example, around ten times less) than that of low loss laminates, and the cost for interposer with FR4 is relatively low as well, the manufacture cost is highly reduced according to the present invention.

According to an embodiment of the presently claimed invention, the built-up layers for the hybrid substrate with similar coefficient thermal expansion (CTE) provide good thermo-mechanical stability and reduce the warpage behavior. Additionally, a sandwiched structure such as (ceramic-PTFE upper layer/FR4 interposer/PI lower layer) further improves the mechanical stiffness as FR4 is reinforced with woven glass.

Preferably, the material for the upper layer can be any dielectric material with low loss tangent but high relative permittivity such as ceramic-PTFE composite. The material for the lower layer can be any dielectric material with high loss tangent but low permittivity such as polyimide, polyphenylene ether, or BCB material. The material for the interposer is any dielectric material with high loss tangent such as an epoxy with fiberglass including FR4 or BT.

To summarize, FIG. 5 is a table indicating materials used for the three layers, and their corresponding properties. For the upper layer, a ceramic-PTFE composite with $\epsilon_r$=10.2, tan δ=0.002, and CTE=47 is employed. For the interposer, a FR4 epoxy, referring to a composite material composed of woven fiberglass cloth with an epoxy resin binder that is flame resistant, with $\epsilon_r$=4.0, tan δ=0.02, and CTE=50 is employed. For the lower layer, a polyimide (PI) Kapton with $\epsilon_r$=3.5, tan δ=0.01, and CTE=20 is employed. Generally, the material cost for the interposer and the lower layer is much lower than that of the upper layer.

FIG. 6A shows a first exemplary package according to the presently claimed invention. Due to cost reduction, there is another region 611 with different dielectric material (preferably high loss dielectrics) close to RFIC power I/Os 612 in an upper layer 613. Through inserting embedded decoupling capacitors 614 within the region 611, and close to the I/Os 612, the current loop path is minimized, and the noise to the RFIC is reduced as well.

FIG. 6B shows a second exemplary package according to the presently claimed invention. An interposer is integrated with a lower layer 621 so that the total thickness of the package can be further reduced. In this embodiment, a RFIC 622 is positioned in an opening 623 of the lower layer 621, and the components 624 are embedded in the lower layer 621. A ground plane in the upper layer can be used for achieving electrical isolation. Also, the shielding enclosure, which is composed of metal sidewalls and ground planes in the upper and lower layer, is formed to protect the RFIC 622.

Figure 6C:
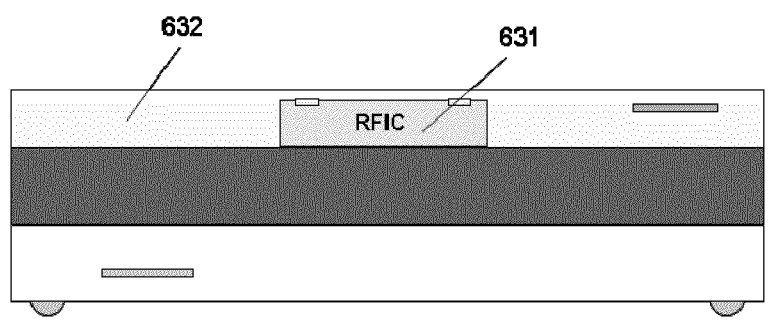
FIG. 6C is a cross sectional view of a third exemplary package according to the presently claimed invention.

FIG. 6C shows a third exemplary package according to the presently claimed invention. A RFIC 631 is positioned in an upper layer 632.

Figure 6D:
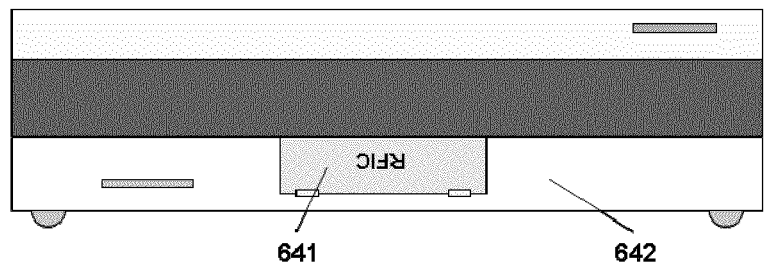
FIG. 6D is a cross sectional view of a fourth exemplary package according to the presently claimed invention.

FIG. 6D shows a fourth exemplary package according to the presently claimed invention. A RFIC 641 is positioned in a lower layer 642.

Figure 7:
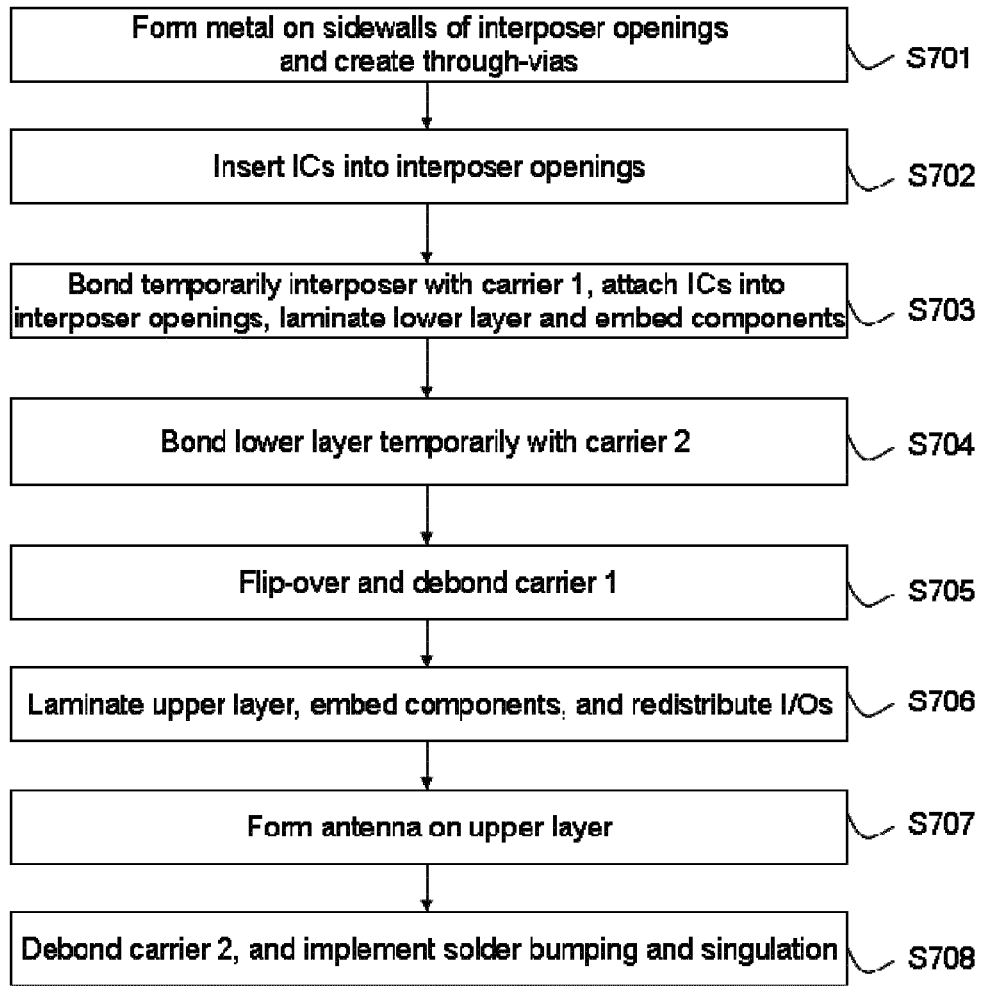
FIG. 7 is a process flow diagram illustrating the steps of a method for fabricating a package for radio frequency signal system under panel-level packaging according to an embodiment of the presently claimed invention.

FIG. 7 illustrates a process flow diagram illustrating steps of a method for forming a package for RF signals system in panel-level packaging according to an embodiment of the presently claimed invention. In step 701, metal is electroplated or deposited on sidewalls of interposer openings, and through-substrate vias are created in the interposer by drilling or etching. In step 702, integrated circuits (ICs) are inserted into the interposer openings by pick and place process. In step 703, the interposer is temporarily bonded with a carrier 1, then the ICs are adhesively attached with the interposer openings. Then a lower layer is laminated or deposited on the interposer with a series of sublayers. Later on, metallization is formed by electroplating and subsequent patterning. In the present invention, patterning includes mask alignment, exposure, developing, metal etching, and mask removal etc. Also, components such as inductor or capacitor are embedded in the lower layer during formation of the lower layer. In step 704, the lower layer is temporarily bonded with a carrier 2. In step 705, the assembly is flipped-over, and the carrier 1 is debonded. In step 706, an upper layer is laminated or deposited on the interposer with a series of sublayers. Similar to step 703, metallization is then formed and thus the I/Os of ICs are redistributed in the upper layer. In addition, components such as balun or coupler are embedded in the upper layer during formation of the upper layer. In step 707, an antenna is formed on the upper layer by printing or plating. In step 708, the carrier 2 is debonded, and solder bumping and singulation are implemented.

Figure 8A:
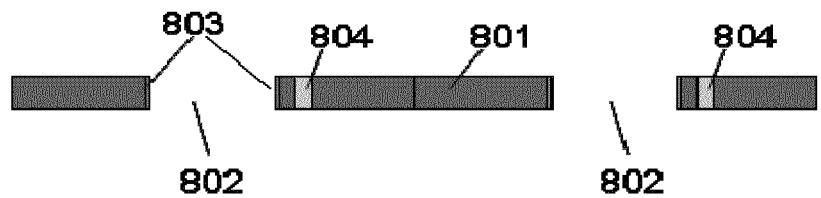
FIG. 8A-8H show a process flow for fabricating a package for radio frequency signal system under panel-level packaging according to an embodiment of the presently claimed invention.
Figure 8B:
Figure 8C:
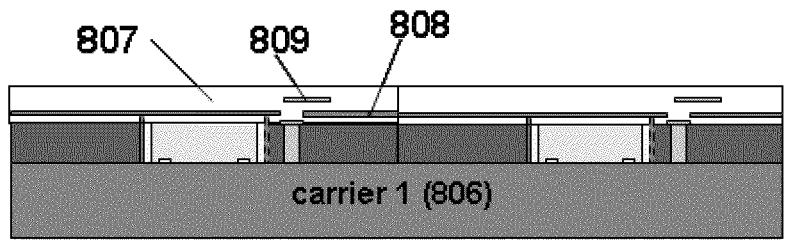
Figure 8D:
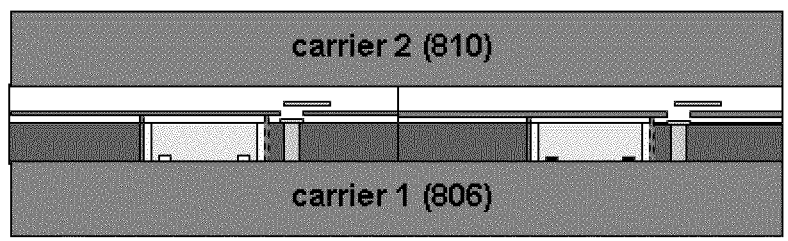
Figure 8E:
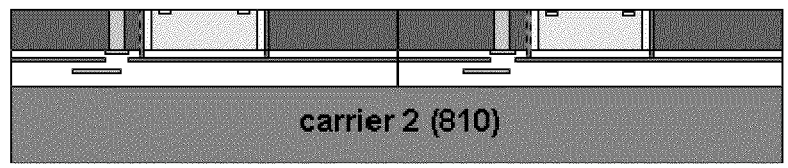
Figure 8F:
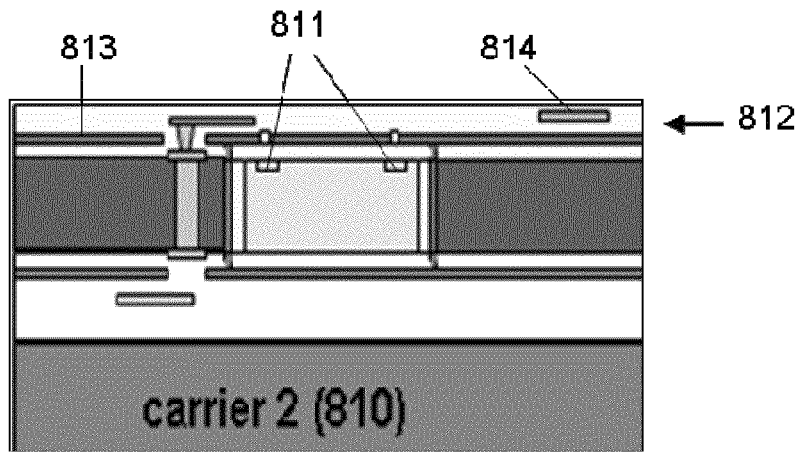
Figure 8G:
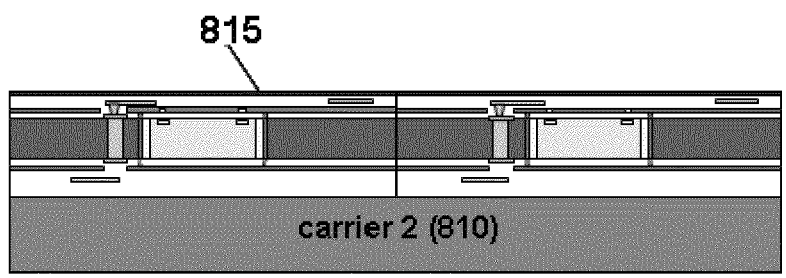
Figure 8H:
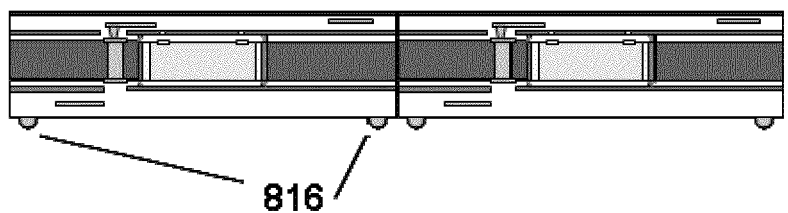

FIG. 8A-H show a process flow for forming a package for RF signal system according to an embodiment of the presently claimed invention. In FIG. 8A, metal is electroplated or deposited on sidewalls of drilled or etched interposer openings 802 of a substrate interposer 801 to form metal sidewalls 803. Through-substrate vias 804 are created in the substrate interposer 801. In FIG. 8B, integrated circuits (ICs) 805 are inserted into the interposer openings 802. In FIG. 8C, the interposer is temporarily bonded with a carrier 1 (806), then the ICs 805 are attached with the interposer openings 802. A lower layer 807 is laminated or deposited on the interposer 801. Ground plate 808 is formed by metal patterning. Also components 809 are embedded in the lower layer 807 during formation of the lower layer. In FIG. 8D, a carrier 2 (810) is temporarily bonded on the lower layer 807. In FIG. 8E, the assembly is flipped-over, and the carrier 1 (806) is debonded. In FIG. 8F (shown as a magnified view), an upper layer 812 is laminated or deposited on the interposer 801. Metallization is then formed and thus the I/Os 811 of ICs are redistributed in the upper layer. Ground plates 813 are also formed by metal patterning. In addition, components 814 are embedded in the upper layer 812 during formation of the upper layer. In FIG. 8G, an antenna 815 attached on the upper layer 812 can be obtained by printing or plating. Alternatively, the antenna 815 is pre-formed in the flexible substrate and adhesively bonded on the upper layer 812. In FIG. 8H, the carrier 2 (810) is debonded, then solder pumps 816 are formed on the lower layer 807 by plating or screen printing. Finally, panel singulation is implemented with mechanical saw or laser cut.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A package for compact radio frequency signal system, comprising: a hybrid substrate with a sandwiched structure, and the hybrid substrate comprising a first dielectric layer and a second dielectric layer being separated by an interposer; wherein the first dielectric layer, located on one side of the interposer, with a first value of loss tangent carries one or more first components operable for transmitting radio frequency signal of at least one active component to at least one antenna arranged on top of the first dielectric layer; wherein the second dielectric layer, located on another side of the interposer, with a second value of loss tangent carries one or more second components operable for transmitting low frequency signal of at least one active component to at least one outside circuit; wherein the at least one active component is embedded in the hybrid substrate; and wherein the first value of loss tangent is lower than the second value of loss tangent; wherein at least one opening is formed through the interposer, and the active component is configured in the opening between the first and second dielectric layers, wherein at least one metal layer is formed on sidewalls of the opening to surround the active component, such that the metal sidewalls connecting with at least one first ground plate in the first dielectric layer and at least one second ground plate in the second dielectric layer constitute a self-shielding enclosure inside the package to protect the active component.

2. The package of claim 1, wherein the active component includes a radio frequency integrated circuit chip, power management chip or digital signal chip.

3. The package of claim 1, wherein the first value of loss tangent is lower than 0.01, and the second value of loss tangent is in between 0.01 and 1.

4. The package of claim 1, wherein a first value of relative permittivity of the first dielectric layer is higher than a second value of relative permittivity of the second dielectric layer.

5. The package of claim 1, wherein inputs/outputs of the active component are fan-out through bumpless interconnects.

6. The package of claim 1, wherein the first components operable for transmitting radio frequency signal comprise at least one balun or coupler or filter.

7. The package of claim 1, wherein the second components operable for transmitting low frequency signals are further used for transmitting power and digital signals.

8. The package of claim 1, wherein the second components for transmitting low frequency signal comprise at least one capacitor or inductor.

9. The package of claim 1, wherein the first dielectric layer is made from ceramic-polytetrafluoroethylene composite, the interposer is made from epoxy with fiberglass, and the second dielectric layer is made from polyimide.

10. The package of claim 1, wherein the first dielectric layer further comprises a region with a dielectric material being different from that of the first dielectric layer, where at least one decoupling capacitor is embedded, which is located close to inputs/outputs of the active component.

11. The package of claim 1, wherein the at least one active component is configured in the first dielectric layer.

12. The package of claim 1, wherein the at least one active component is configured in the second dielectric layer.

13. A package for compact radio frequency signal system, comprising: a first dielectric layer having a first value of loss tangent; a second dielectric layer having a second value of loss tangent located on one side of the first dielectric layer; and at least one active component positioned inside the second dielectric layer; wherein the first dielectric layer carries one or more first components operable for transmitting radio frequency signal of the active component to at least one antenna arranged on top of the first dielectric layer; wherein the second dielectric layer carries one or more second components operable for transmitting low frequency signal of the active component to at least one outside circuit; and wherein the first value of loss tangent is lower than the second value of loss tangent, wherein at least one metal layer is formed on sidewalls of the opening to surround the active component, such that the metal sidewalls connecting with at least one first ground plate in the first dielectric layer and at least one second ground plate in the second dielectric layer constitute a self-shielding enclosure inside the package to protect the active component.

* * * * *